United States Patent
Liu et al.

(10) Patent No.: US 9,641,161 B1
(45) Date of Patent: May 2, 2017

(54) FLIP-FLOP WITH DELINEATED LAYOUT FOR REDUCED FOOTPRINT

(71) Applicant: Taiwan Semiconductor Manufacturing Co., Ltd., Hsin-Chu (TW)

(72) Inventors: Chi-Lin Liu, New Taipei (TW); Ting-Wei Chiang, New Taipei (TW); Jerry Chang-Jui Kao, Taipei (TW); Hui-Zhong Zhuang, Kaohsiung City (TW); Lee-Chung Lu, Taipei (TW); Shang-Chih Hsieh, Yangmei (TW); Che Min Huang, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/143,676

(22) Filed: May 2, 2016

(51) Int. Cl.
  *H03K 3/3562* (2006.01)
  *G01R 31/3177* (2006.01)
  *G01R 31/317* (2006.01)

(52) U.S. Cl.
  CPC ..... *H03K 3/35625* (2013.01); *G01R 31/3172* (2013.01); *G01R 31/3177* (2013.01)

(58) Field of Classification Search
  CPC ... H03K 3/356; H03K 3/3562; H03K 3/35625
  USPC ....... 327/199, 202, 203, 208, 210, 211, 212, 327/214, 215, 218, 225
  See application file for complete search history.

(56) References Cited

U.S. PATENT DOCUMENTS

| | | | | |
|---|---|---|---|---|
| 4,602,210 A | * | 7/1986 | Fasang | G01R 31/318572 714/731 |
| 5,172,011 A | * | 12/1992 | Leuthold | G01R 31/318552 326/93 |
| 7,843,218 B1 | * | 11/2010 | Ramaraju | G01R 31/318541 326/38 |
| 2004/0148554 A1 | * | 7/2004 | Dervisoglu | G01R 31/318335 714/727 |
| 2007/0028157 A1 | * | 2/2007 | Drake | G06F 11/1666 714/797 |
| 2013/0027105 A1 | * | 1/2013 | Horng | H03K 5/1515 327/288 |
| 2016/0097811 A1 | * | 4/2016 | Kim | G01B 31/318541 714/726 |

* cited by examiner

*Primary Examiner* — William Hernandez

(74) *Attorney, Agent, or Firm* — Eschweiler & Potashnik, LLC

(57) ABSTRACT

In some embodiments, a flip-flop is laid-out on a flip-flop region of a semiconductor substrate. The flip-flop includes master switch circuitry made of a first plurality of devices which are circumscribed by a master switch perimeter residing within the flip-flop region. Scan mux input circuitry is operably coupled to an input of the master switch circuitry. The scan mux input circuitry is made up of a second plurality of devices that are circumscribed by a scan mux perimeter which resides within the flip-flop region and which is non-overlapping with the master switch perimeter. Slave switch circuitry is operably coupled to an output of the master switch circuitry. The slave switch circuitry is made up of a third plurality of devices that are circumscribed by a slave switch perimeter which resides within the flip-flop region and which is non-overlapping with both the master switch perimeter and the scan mux perimeter.

20 Claims, 11 Drawing Sheets

FLIP-FLOP WITH DELINEATED LAYOUT FOR REDUCED FOOTPRINT

BACKGROUND

In electronics, a flip-flop is a circuit that has two stable states and can be used to store digital information. Flip-flops are a fundamental building block of digital electronics systems and are used to store data in computers, communications, and many other types of systems. A flip-flop includes an input terminal on which data to be stored is received, a clock terminal on which a clock signal is received, and an output terminal at which data stored in the flip-flop is delivered.

A flip-flop typically stores a single bit (binary digit) of data, as evidenced by two different states. One of its two states represents a "one" and the other represents a "zero". Thus, the output terminal of the flip-flop produces a signal that "flips" and "flops" between the "one" state and the "zero" state in a manner that depends on the input data and the clock signal provided to the flip-flop. Flip-flops can be used for any number of applications in electronics circuits, such as counting of pulses, storing data values, and/or synchronizing variably-timed input signals to some reference timing signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
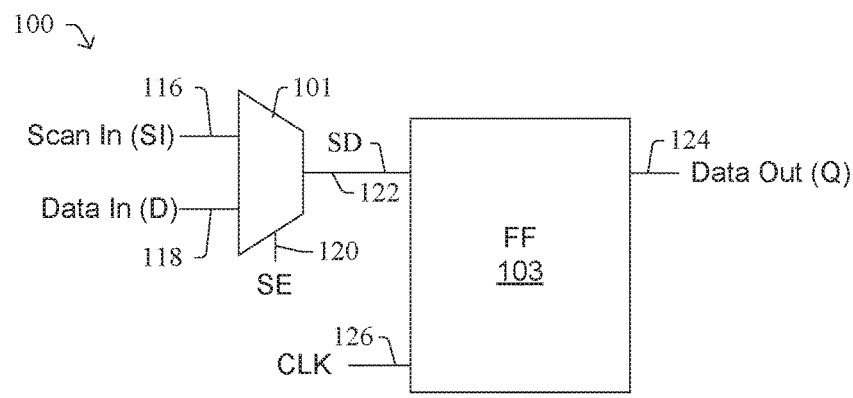
FIG. 1A illustrates a schematic view of a scan flip-flop according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Flip-flops are widely used in digital circuits and are manufactured by building up successive semiconductor layer(s), metal layer(s), and/or insulating layer(s) over one another. These layers are successively patterned using photolithography to form extremely small circuit features that collectively build up flip-flops and other elements on an integrated circuit (IC). Some of the layers form active device features in the semiconductor substrate, while other layers establish metal interconnect that couple the active device features to one another. The patterned layers are collectively referred to as a "layout" for the IC. During photolithographic patterning of a layer, a mask is formed over the layer, and portions of the layer can be selectively removed based on the mask to establish a desired pattern for the layer. Unfortunately, masks are expensive, and it is generally desirable to limit the number of masks to limit manufacturing costs. It is also desirable to attempt to shrink the area or "footprint" of the circuit, as this allows more ICs to be made on a single semiconductor wafer and correspondingly reduces manufacturing costs.

Conventional flip-flop layouts require a large number of masks, significant area, and a significant amount of routing. The routing may contribute to the large number of masks and may escalate the area consumed by the chip, and may also lead to large capacitance that leads to slower switching times for the flip-flop. The present disclosure provides for a number of improved flip-flop layouts. In these layouts, the transistors of the flip-flop layout are grouped into several sub-blocks that are arranged in an efficient manner to limit routing and area concerns. By segmenting the flip-flop into several well-delineated pieces and then arranging these pieces according to pre-determined floor-plans on the integrated circuit, the disclosed flip-flops exhibit reduced area and routing and correspondingly reduced manufacturing costs and improved switching times.

FIG. 1A shows a block diagram of a scan flip-flop 100, which includes a scan multiplexer 101 and a flip-flop 103, in accordance with some embodiments. The scan flip-flop 100 includes two data inputs—namely a scan data input (SI) 116 and a "normal" data input (D) 118. SI 116 can deliver a test vector signal, such used in Built-In-Self-Test (BIST) scanning or boundary test scanning for example, and D 118 can deliver actual application data rather than test data. A scan enable (SE) signal governs whether SI or D is selected. For example, if SE 120 is enabled (e.g., SE is set to a logical "1"), the scan multiplexer 101 passes SI 116 through to the multiplexer output 122. On the other hand, if SE 120 is disabled (e.g., SE is set to a logical "0"), the scan multiplexer 101 passes D 118 through to the multiplexer output 122.

The flip-flop 103 has an input terminal coupled to the multiplexer output 122, and provides an output data signal (Q) at flip-flop output terminal 124. The output data signal Q is based on the present state stored in the flip-flop 103, the selected data (SD) signal on 122, and the CLK signal 126. The output data signal Q "flips" and "flops" between a "one" state and a "zero" state in a manner that depends on the SD signal 122 and the CLK signal 126. Generally, the flip-flop 103 continues to output its currently stored state as output data Q until the CLK signal 126 exhibits a rising and/or falling edge (regardless of changes in the SD signal 122). When the CLK signal 126 exhibits a rising and/or falling edge, only then will the flip-flop 103 "store" the present state of the SD signal 122 and deliver this state to data output (Q). For example, if the flip-flop 103 initially stores a "1" state, so long as the CLK signal 126 does not "tick" from a logical low to a logical high (and/or vice versa), the flip-flop 103 will continue to provide a "1" state at flip-flop output terminal 124, even if the SD signal 122 changes to a zero state. Thus, the flip-flop 103 keeps the "1" stated "stored" until the CLK 126 changes state. If a "1" is still present in SD signal at the multiplexer output 122 when CLK 126 changes state, the flip-flop 103 will again "clock" (store) the "1" state for another clock cycle. In contrast, if a "0" state is present at SD 122 when the CLK 126 changes state, the flip-flop will "clock" (store) the "0" state for the ensuing clock cycle and correspondingly output a "0" at flip-flop output terminal 124.

Figure 1B:
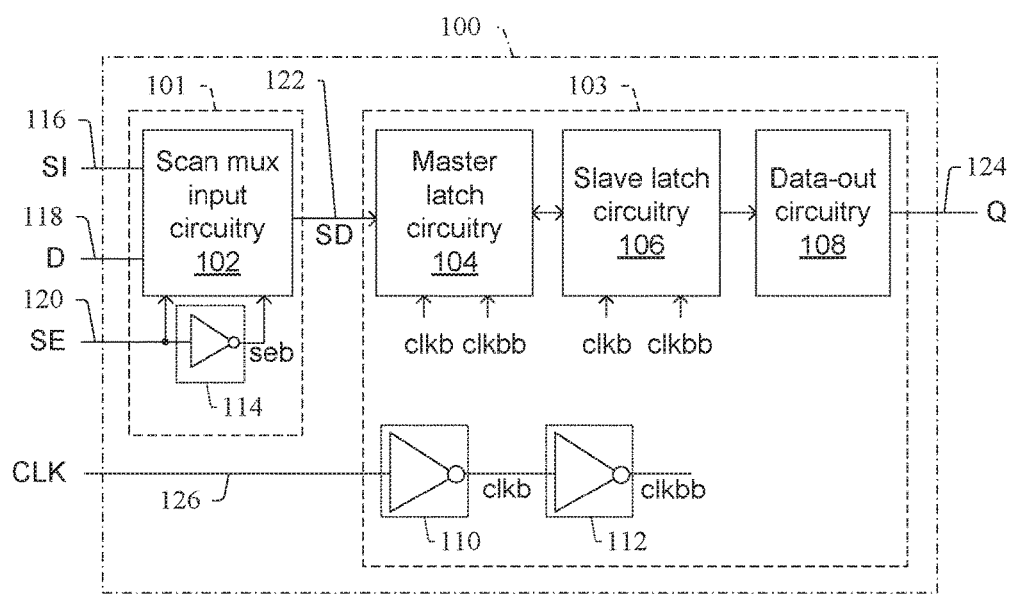
FIG. 1B illustrates a block diagram of functional blocks that make up a scan flip-flop according to some embodiments of the present disclosure.

As depicted in FIG. 1B, scan flip-flop 100 can include scan multiplexer 101 and flip-flop 103, which can each include several functional blocks. The scan multiplexer 101 can include scan mux input circuitry 102 and a scan enable inverter 114, while the flip-flop 103 can include master latch circuitry 104, slave latch circuitry 106, data out circuitry 108, a first clock inverter 110, and a second clock inverter 112. The scan mux input circuitry 102 receives two data signals—an SI signal and a D signal—as well as a scan enable (SE) signal and a scan enable bar signal (seb), which is received from the scan enable inverter 114. An output of the scan mux input circuitry 102 is coupled to an input of the master latch circuitry 104. The master latch circuitry 104 and slave latch circuitry 106 are often cross-coupled to store a data state in mutually reinforcing fashion, and each receives a clock bar signal (clkb) and a clock bar bar (clkbb) signal. The clkb and clkbb signals are based on CLK signal 126 and are provided by first and second clock inverters 110, 112, respectively, and are inverted versions of one another with a slight delay between them. The data out circuitry 108 has an input coupled to an output of the slave latch circuitry 106 and delivers a data out signal (Q) at flip-flop output terminal 124. Each of these functional blocks can take various forms, depending on the implementation. However, whatever the precise implementation for these various functional blocks, the present disclosure finds an appreciation that by piecing the transistors of these functional blocks into separate regions of a flip-flop layout; the silicon area, number of masks, and/or routing required for the scan flip-flop 100 can be reduced, thereby streamlining manufacturing and reducing costs associated with circuit manufacture.

Figure 1C:
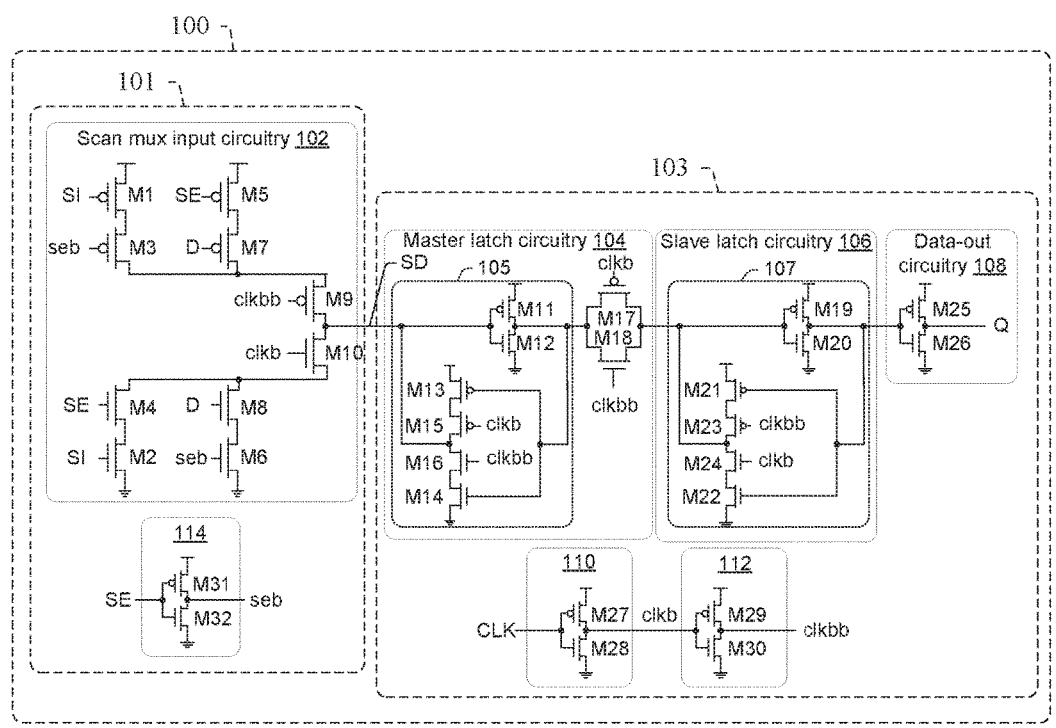
FIG. 1C illustrates an example of a detailed schematic view of a scan flip-flop according to some embodiments of the present disclosure.

FIG. 1C shows a more detailed schematic of an example scan flip-flop 100. As shown in FIG. 1C, the scan flip-flop 100 is made up of thirty-two transistors labeled as M1, M2, M3, M4, ..., M32. More particularly, the first ten transistors M1, M2, ..., M10 are operably coupled to form scan mux input circuitry 102. Transistors M11, M12, ..., M18 are operably coupled to form master latch circuitry 104. The master latch circuitry 104 includes a first set of cross-coupled inverters 105, wherein M11, M12 establish a first inverter and transistors M13-M16 establish a second inverter that is selectively enabled based on clkb and clkbb. A transmission gate M17, M18 couples the master latch circuitry 104 to slave latch circuitry 106. Transistors M19, M20, ..., M24 are operably coupled to form slave latch circuitry 106. Slave latch circuitry 106 includes a second set of cross-coupled inverters 107, wherein transistors M19, M20 establish a third inverter and transistors M13-M16 establish a fourth inverter that is selectively enabled based on clkb and clkbb. Data out circuitry 108 includes a fifth inverter made up of transistors M25, M26, and inverts the output of the slave latch circuitry 106 such that the output Q has the same polarity (i.e., is non-inverted) with regards to the original data inputs D and SI. Transistors M27, M28 make up first clock inverter 110; transistors M29, M30 make up a second clock inverter 112; and transistors M31, M32 make up scan enable inverter 114. As with the example of FIG. 1B, the example circuit of FIG. 1C can take various forms and does not in any way limit the present disclosure.

Figure 2:
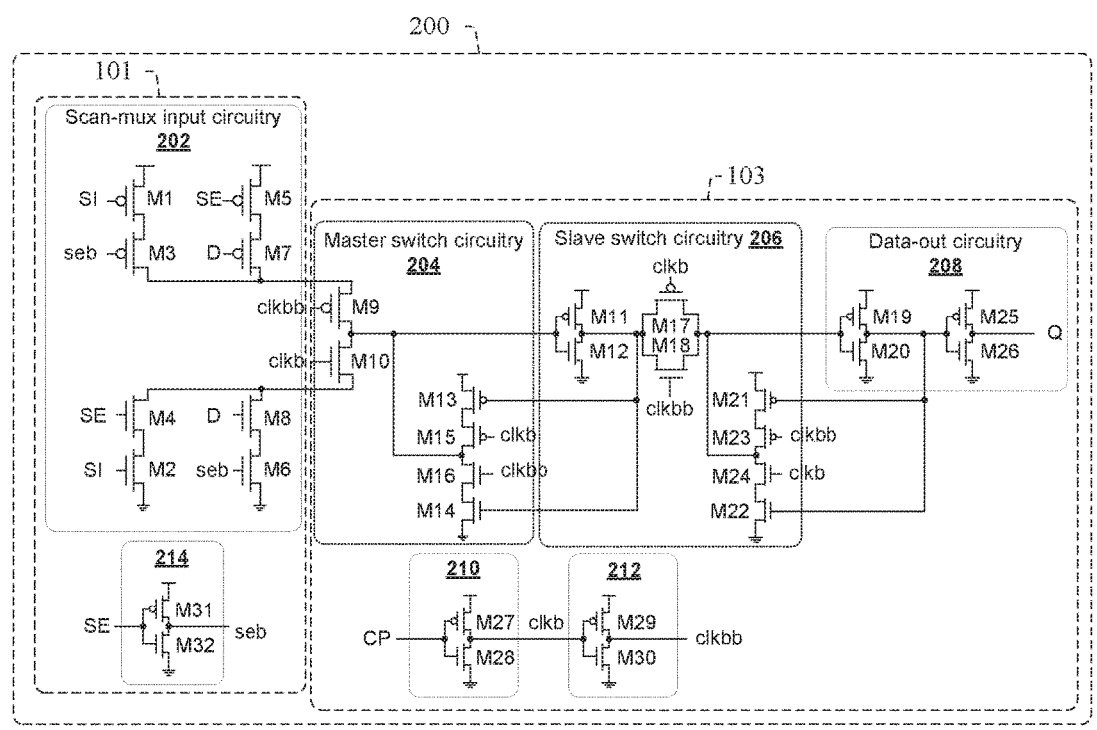
FIG. 2 illustrates another detailed schematic of a scan flip-flop where the functional blocks have been re-labeled according to some embodiments of the present disclosure.

As shown in FIG. 2, in some embodiments of the present disclosure, the functional blocks depicted in FIG. 1C can be re-drawn to correspond to scan mux input circuitry 202, master switch circuitry 204, slave switch circuitry 206, data out circuitry 208, first clock inverter 210, second clock inverter 212, and scan enable inverter 214. Thus, in FIG. 2's embodiment, the scan mux input circuitry 202 now includes transistors M1-M8; master switch circuitry 204 includes transistors M9, M10, M13, M14, M15, M16; slave switch circuitry 206 includes transistors M11, M12, M17, M18, M21, M22, M23, M24; and data out circuitry 208 now includes M19, M20, M25, M26.

Figure 3:
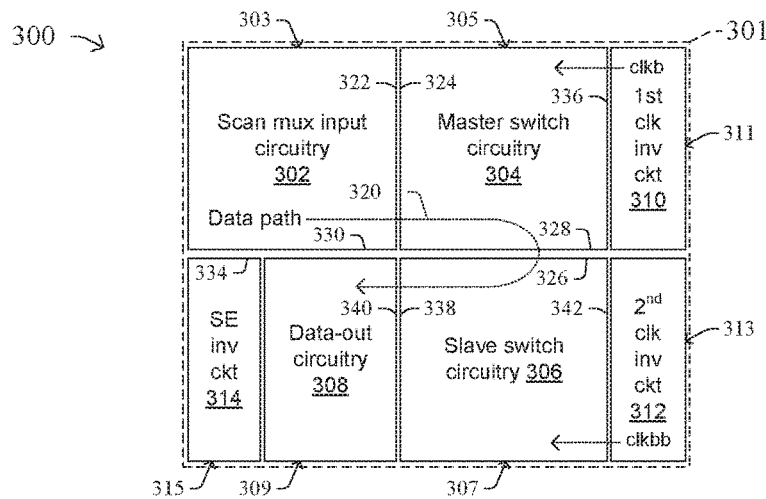
FIG. 3 illustrates a floor planning or layout view of a scan flip-flop according to some embodiments of the present disclosure.

FIG. 3 illustrates some embodiments of a floor planning diagram for transistors within an integrated circuit layout 300 to implement a scan flip-flop (e.g., scan flip-flop 200 of FIG. 2). The features of the layout 300 are disposed on a flip-flop region of a semiconductor substrate, wherein the flip-flop region is circumscribed by a flip-flop perimeter 301, which is rectangular in some embodiments. Within this flip-flop perimeter 301, transistors of the flip-flop are divided amongst a scan mux perimeter 303, a master switch perimeter 305, a slave switch perimeter 307, a data out perimeter 309, a first clock inverter perimeter 311, a second clock inverter perimeter 313, and a scan enable (SE) inverter perimeter 315. The scan mux perimeter 303 surrounds the transistors of scan mux input circuitry 302 (e.g., scan mux input circuitry 202, FIG. 2). The master switch perimeter 305 surrounds the transistors of master switch circuitry 304 (e.g., master switch circuitry 204, FIG. 2). The slave switch perimeter 307 surrounds the transistors of slave switch circuitry 306 (e.g., slave switch circuitry 206, FIG. 2). The data out perimeter 309 surrounds transistors of the data out circuitry 308 (e.g., data out circuitry 208, FIG. 2). The first clock inverter perimeter 311 surrounds transistors of first clock inverter circuitry 310 (e.g., first clock inverter 210, FIG. 2), a second clock inverter perimeter 313 surrounds transistors of a second clock inverter circuit 312 (e.g., second clock inverter 212, FIG. 2), and SE inverter perimeter 315 surrounds transistors of scan enable inverter circuitry 314 (e.g., scan enable inverter 214, FIG. 2). These perimeters 303-315 are typically non-overlapping with one another. In some embodiments, each of these perimeters 303-315 are rectangular, which means they have fourth straight sides (equal or unequal in length) and four right angles.

Data generally flows through this layout 300 as shown by data path arrow 320. Thus, data, such as SI and D data signals, arrive at the scan mux input circuitry 302, and after the scan mux input circuitry 302 selects one of the data signals, the scan mux input circuitry 302 passes the selected data to the master switch circuitry 304. The master switch circuitry 304 and slave switch circuitry 306 then store the selected data state at a rising and/or falling edge of clock signals clkb, clkbb, respectively, which are provided by first clock inverter circuitry 310 and second clock inverter circuitry 312, respectively.

In FIG. 3's embodiment, the scan mux input perimeter 303 has a first scan mux input edge 322 that abuts a first master switch edge 324 of the master switch perimeter 305. The slave switch perimeter 307 has a first slave switch edge 326 that abuts a second master switch edge 328 of the master switch perimeter 305. In the embodiment of FIG. 3, the first master switch edge 324 and second master switch edge 328 are perpendicular to one another. The scan mux input perimeter 303 has a second scan mux input edge 330 that abuts an upper edge 322 of data out perimeter 309 as well as an upper edge 334 of the SE inverter perimeter 315. The master switch perimeter 305 has a third master switch edge 336 that abuts a side edge of the first clock inverter perimeter 311. The slave switch perimeter 307 has a second slave switch edge 338 that abuts an edge 340 of the data out circuit 308, and has a third slave switch edge 342 that abuts an edge of the second clock inverter perimeter 313. This well-structured floor planning layout 300 can reduce routing.

Figure 4:
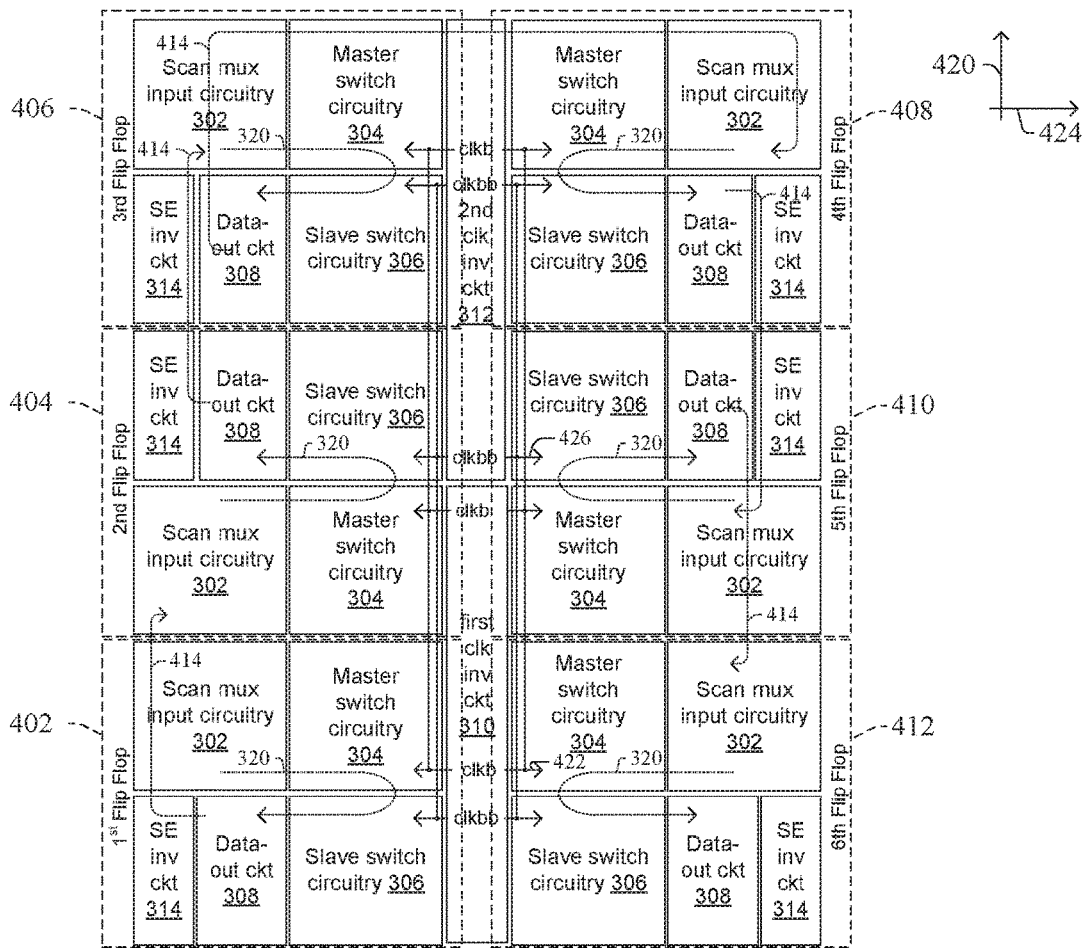
FIG. 4 illustrates a floor planning or partial layout view of a series of six scan flip-flops of FIG. 3 arranged according to some embodiments of the present disclosure.

A series of flip-flops, each laid out as depicted in FIG. 3, can be arranged in an array as part of a scan chain, shift register, or other circuit. FIG. 4 illustrates an example where six scan flip-flops are arranged in series with one another, so an output of one flip-flop is coupled to an input of the next flip-flop. Thus, FIG. 4 illustrates a first scan flip-flop 402, second scan flip-flop 404, third scan flip-flop 406, fourth scan flip-flop 408, fifth scan flip-flop 410, and sixth scan flip-flop 412, which are arranged in series with one another. Arrows 414 show how outputs of preceding respective flip-flops are coupled to inputs of the respective following flip-flops. The flip-flops are arranged to have edges that directly abut one another to provide a compact layout, and first and second clock inverter circuits 310, 312 are shared between the flip-flops. The first and second clock inverter circuits 310, 312 are arranged between a first column of flip-flops and a second column of flip-flops. The first and second clock inverter circuits 310, 312, which lie on a line extending in a first direction 420, separate neighboring columns of flip-flops. The first clock inverter circuitry 310 receives a clock signal and provides a clock-bar signal on a first clock line 422 to the flip-flops. The first clock line 422 extends in a second direction 424, which is perpendicular to the first direction 420. The second clock inverter circuit 312 receives the clock-bar signal and provides a clock-bar-bar signal on a second clock line 426 to the flip-flops.

An advantage of the layout of FIG. 4 (and some other embodiments illustrated herein) is that there is only one clock signal per row of sub-cells, which results in less coupling and better performance. For example, for the upper most row of flip-flops 406, 408, the clkb signal is the only clock signal for a first row of sub-cells (blocks 302 and 304) while the clkbb signal is the only clock signal for a second row of sub-cells (blocks 306, 308, 314). In addition, the cells have been aligned to limit clkb/clkbb routing as is now described in more detail with regards to FIG. 5A.

Figure 5A:
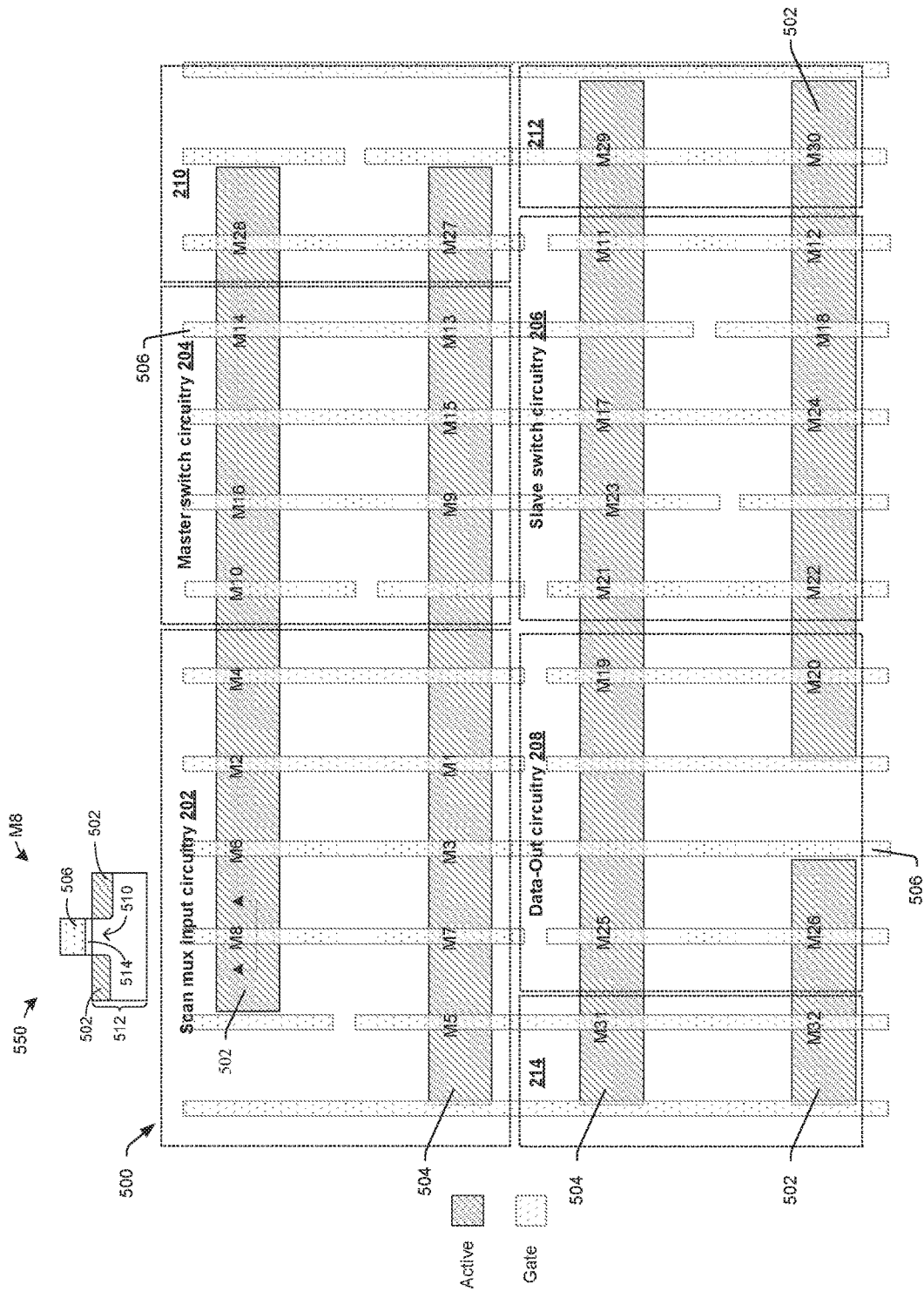
FIGS. 5A-5D illustrate a more detailed floor planning or layout view of a scan flip-flop according to some embodiments of the present disclosure.
Figure 5B:
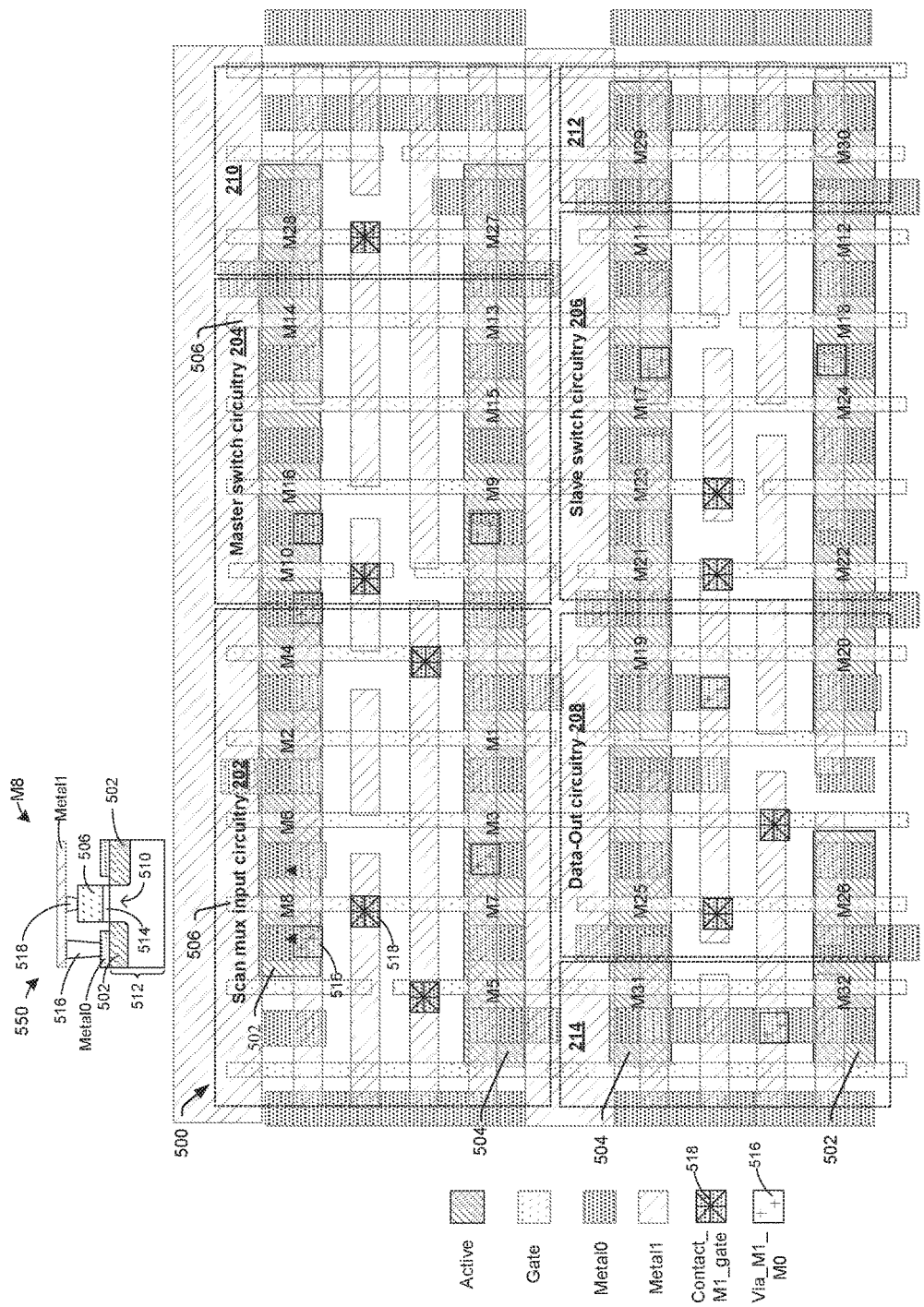
Figure 5C:
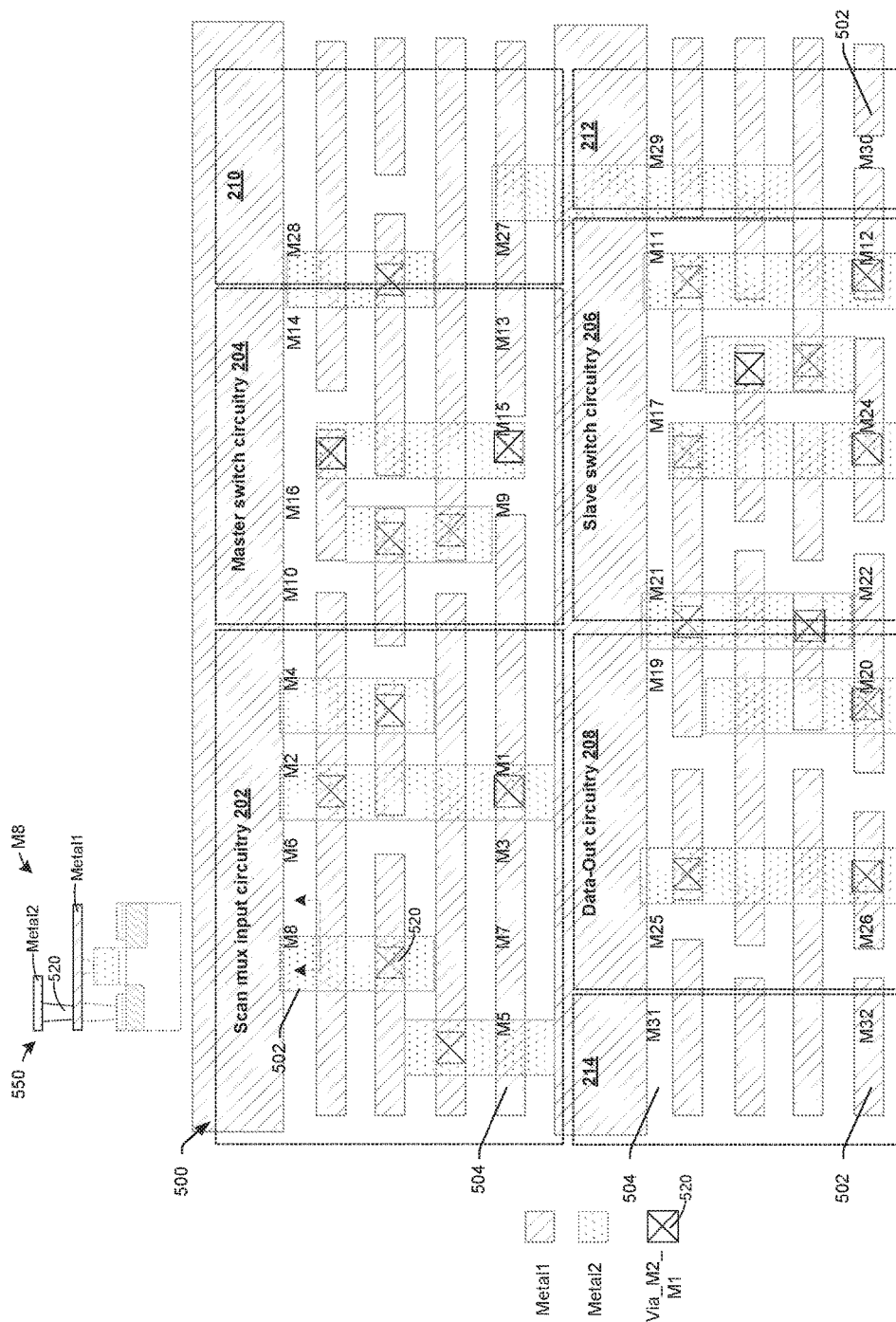
Figure 5D:
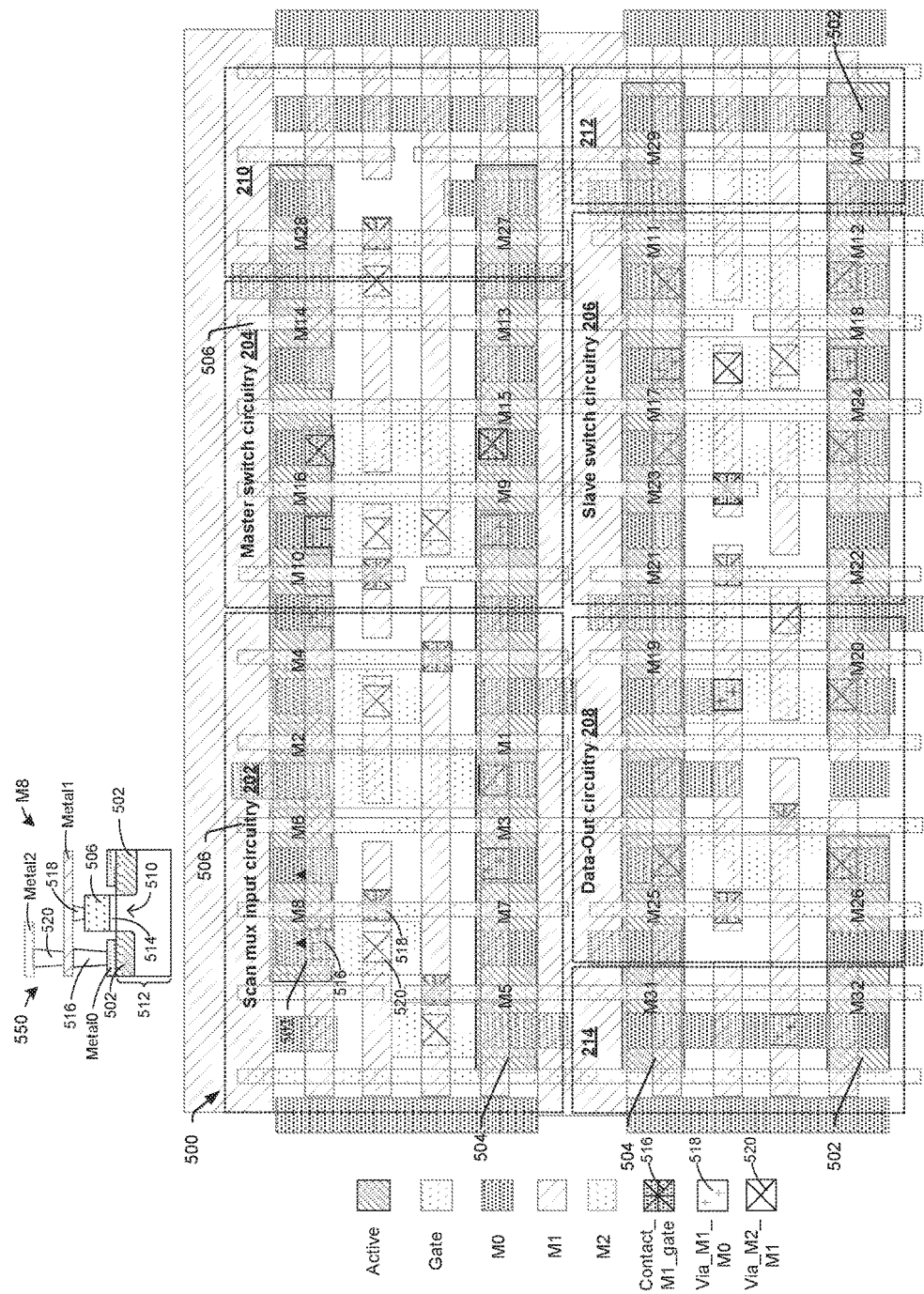

FIGS. 5A-5D depict several views of a portion of a layout 500 showing a more detailed example of how the thirty-two transistors M1, M2, . . . M32 of FIG. 2's scan flip-flop 200 can be arranged as an IC layout 500 on a semiconductor substrate. For clarity, FIGS. 5A-5C show different layers contained within the layout as separate drawings, although it will be appreciated that the final layout will typically include all layers of FIGS. 5A-5C (as well as other layers in many cases), such as shown in FIG. 5D, which shows the superposition of the layers of FIGS. 5A-5C.

FIG. 5A is consistent with FIG. 3's floor planning layout, but does not limit FIG. 3's floor planning layout in any regard. The layout 500 includes n-type active regions 502 and p-type active regions 504. Gate structures 506, which are typically made of doped polysilicon or metal, extend over the active areas 502, 504 and cover channel regions in a semiconductor substrate, wherein the channel regions have a doping type that is opposite to that of the surrounding active regions 502, 504. For simplicity, only three gate structures 506 are labeled. As shown in FIG. 5A's layout 500, the various functional blocks (202-214) depicted in FIG. 2 are each confined to their own non-overlapping areas, which simplifies routing and reduces area. Notably, the devices which receive clock signals clkb, clkbb have been arranged to fall entirely into the right-hand portion of this layout to reduce the clock routing. Thus, transistors M9, M10, M15, M16, M17, M18, M23, M24, M27, M28, M29, and M30 have all been grouped in close proximity. In the illustrated layout, these devices are arranged in approximately one-half of the cell width, but in other embodiments the devices could be arranged in approximately two-thirds of the cell width or less than one-half of the cell width. By grouping these devices together, the length of the clock lines can be reduced, which helps limit capacitance and improves operational speed of the device. A cross-sectional view 550 for transistor M8 is illustrated near the top of FIG. 5A to show one example of how a gate structure 506 can extend over an active region 502 and cover a channel region 510 in a semiconductor substrate 512. A gate dielectric 514, such as a high-k gate dielectric or a silicon dioxide gate dielectric, separates the gate structure 506 from the channel region 510.

FIG. 5B depicts layout 500 where additional layers have been added to the layout of FIG. 5A. FIG. 5B again shows an example of how the thirty-two transistors M1, M2, . . . , M32 can be arranged. In FIG. 5B, a metal 0 (Metal0) layer overlies active regions 502, 504, and is made up of segments that run generally perpendicular to the active regions. A metal 1 (Metal1) layer is stacked over the Metal0 layer and over the gate structure 506, and is made up of segments that run generally in parallel with the active regions and perpendicular to the Metal0 segments. First contacts 516 extend vertically between the Metal0 and Metal1 segments to ohmically couple the Metal0 and Metal1 segments to one another. For simplicity, only one first contact 516 is labeled in the layout view of FIG. 5B. Second contacts 518 extend vertically between the Metal1 segments and gate structures to ohmically couple the Metal segments and the gate structure 506 to one another. For simplicity, only one second contact 518 is labeled in the layout view of FIG. 5B. As shown in cross-sectional view 550 for transistor M8 near the top of FIG. 5B, the metal0 layer extends over the active region 502, and the metal 1 layer extends over the metal0 layer. First contacts 516 extend vertically between the metal0 and metal 1 layers, while second contacts extend vertically between the metal 1 layer and gate structures 506.

In FIG. 5C, a metal 2 (Metal2) layer overlies the metal 1 layer (metal1). The metal 2 layer is made up of segments that run generally perpendicular to the Metal1 segments. Third contacts 520 extend vertically between the Metal1 and Metal2 segments to ohmically couple the Metal1 and Metal2 segments to one another. For simplicity, only one third contact 520 is labeled in the layout view of FIG. 5C. As shown in cross-sectional view 550 for transistor M8 near the top of FIG. 5C, the Metal2 layer extends over the Metal1 layer, and third contacts 520 extend vertically between the metal2 and metal11 layers.

FIG. 5D shows a superposition of the layers previously illustrated in FIGS. 5A-5C.

Figure 6:
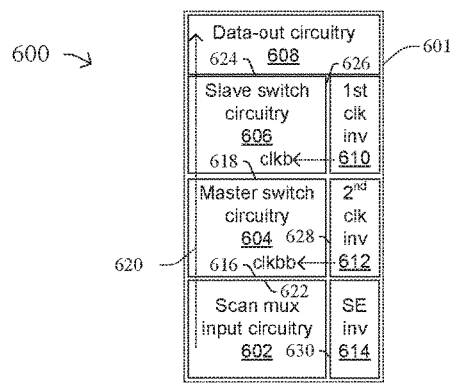
FIG. 6 illustrates another floor planning or layout view of a scan flip-flop according to some embodiments of the present disclosure.

FIG. 6 provides an alternate floor planning diagram 600 for transistors within an integrated circuit layout 600 to implement a scan flip-flop (e.g., scan flip-flop 200 in FIG. 2) in accordance with some embodiments. The features of the layout are again disposed on a flip-flop region of a semiconductor substrate, wherein the flip-flop region is circumscribed by a flip-flop perimeter 601. Within this flip-flop perimeter 601, transistors of the flip-flop are organized into scan mux input circuitry 602, master switch circuitry 604, slave switch circuitry 606, data out circuitry 608, first clock inverter circuitry 610, second clock inverter circuitry 612, and scan enable inverter circuitry 614.

Whereas FIG. 3 illustrated an embodiment of a layout 300 where the first master switch edge 324 and second master switch edge 328 (corresponding to the scan mux input circuitry 302 and slave switch circuitry 306, respectively) are perpendicular to one another, FIG. 6 depicts an alternate example where a first master switch edge 616 (corresponding to the scan mux input circuitry 602) and second master switch edge 618 (corresponding to slave switch circuitry 606) are parallel to one another, such that the scan mux input circuitry 602 and slave switch circuitry 606 are on opposite sides of the master switch circuitry 604.

Data generally flows through this layout as shown by data path arrow 620. Thus, data, such as SI and D data signals, arrive at the scan mux input circuitry 602, and after the scan mux input circuitry 602 selects one of the data signals, the scan mux input circuitry 602 passes the selected data to the master switch circuitry 604. The master switch circuitry 604 and slave switch circuitry 606 then store the selected data state at a rising and/or falling edge of clock signals clkb, clkbb, respectively, which are provided by first clock inverter circuitry 610 and second clock inverter circuitry 612, respectively.

In FIG. 6's embodiment, the scan mux input circuitry 602 has a first scan mux input edge 622 that abuts the first master switch edge 616. The slave switch circuitry 606 has a first slave switch edge that abuts the second master switch edge 618 In the embodiment of FIG. 6, the first master switch edge 616 and second master switch edge 618 are parallel to one another. The slave switch circuitry 606 has a second slave switch edge 624 that abuts a lower edge of data out circuitry 608, and a side edge 626 that abuts the first clock inverter circuitry 610. The master switch circuitry has a side edge 628 that abuts the second clock inverter circuitry 612. The scan mux input circuitry 602 has a side edge 630 that abuts the SE inverter circuitry 614.

Figure 7:
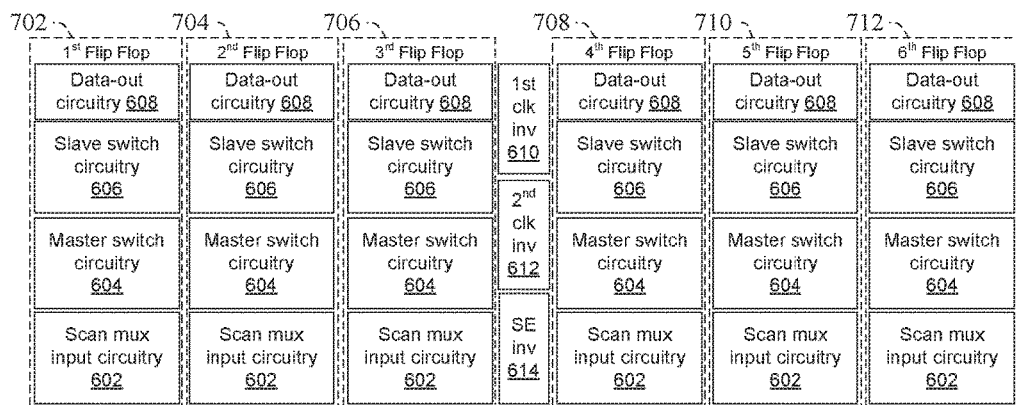
FIG. 7 illustrates a floor planning or layout view of a series of six scan flip-flops of FIG. 6 arranged according to some embodiments of the present disclosure.

FIG. 7 illustrates an example where six scan flip-flops, as laid out according to FIG. 6, are arranged in series with one another, so an output of one flip-flop is coupled to an input of the next flip-flop. Thus, FIG. 7 illustrates a first scan flip-flop 702, second scan flip-flop 704, third scan flip-flop 706, fourth scan flip-flop 708, fifth scan flip-flop 710, and sixth scan flip-flop 712, which are arranged in series with one another. The flip-flops are arranged to have edges that directly abut one another to provide a compact layout. The first and second clock inverter circuitry 610, 612, and scan enable inverter circuitry 614 are arranged between neighboring flip-flops 706, 708.

Figure 8:
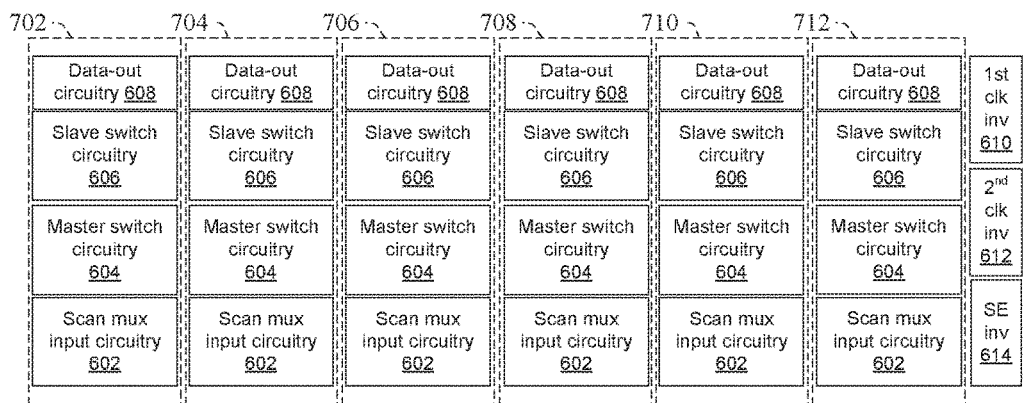
FIG. 8 illustrates a floor planning or layout view of a series of six scan flip-flops of FIG. 6 arranged according to some embodiments of the present disclosure.

FIG. 8 illustrates another example where six scan flip-flops, as laid out according to FIG. 6, are arranged in series with one another, so an output of one flip-flop is coupled to an input of the next flip-flop. Compared to FIG. 7, FIG. 8 is different in that the flip-flops in FIG. 8 are arranged in a contiguous block and the first and second clock inverter circuitry 610, 612, and select enable inverter circuitry 614 are arranged along a peripheral edge of the contiguous block with the flip-flops being arranged only on one side of the contiguous block of flip-flops. By having no flip-flops on the other side of the first and second clock inverter circuitry 610, 612, and select enable inverter circuitry 614, routing can be reduced.

Figure 9:
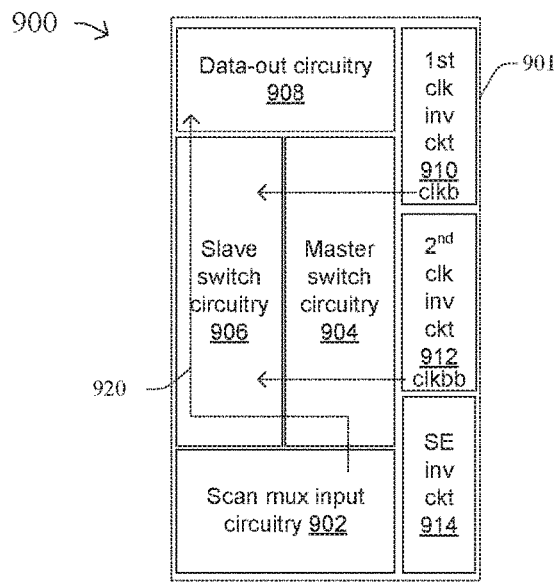
FIG. 9 illustrates another floor planning or layout view of a scan flip-flop according to some embodiments of the present disclosure.

FIG. 9 provides an alternate floor planning diagram 900 for transistors within an integrated circuit layout 900 to implement a scan flip-flop (e.g., scan flip-flop 200 in FIG. 2) in accordance with some embodiments. The features of the layout are again disposed on a flip-flop region of a semiconductor substrate, wherein the flip-flop region is circumscribed by a flip-flop perimeter 901. Within this flip-flop perimeter 901, transistors of the flip-flop are organized into scan mux input circuitry 902, master switch circuitry 904, slave switch circuitry 906, data out circuitry 908, first clock inverter circuitry 910, second clock inverter circuitry 912, and scan enable inverter circuitry 914. The slave switch circuitry 906 and master switch circuitry 904 are arranged to extend vertically between scan mux input circuitry 902 and data out circuitry 908. The slave switch circuitry 906 and master switch circuitry extend generally parallel to one another and may be congruent, such that the scan mux input circuitry 902 and data out circuitry 908 are on separated by the master and slave switch circuitry 904, 906.

Data generally flows through this layout as shown by data path arrow 920. Thus, data, such as SI and D data signals, arrive at the scan mux input circuitry 902, and after the scan mux input circuitry 902 selects one of the data signals, the scan mux input circuitry 902 passes the selected data to the master switch circuitry 904. The master switch circuitry 904 and slave switch circuitry 906 then store the selected data state at a rising and/or falling edge of clock signals clkb, clkbb, respectively, which are provided by first clock inverter circuitry 910 and second clock inverter circuitry 912, respectively.

Figure 10:
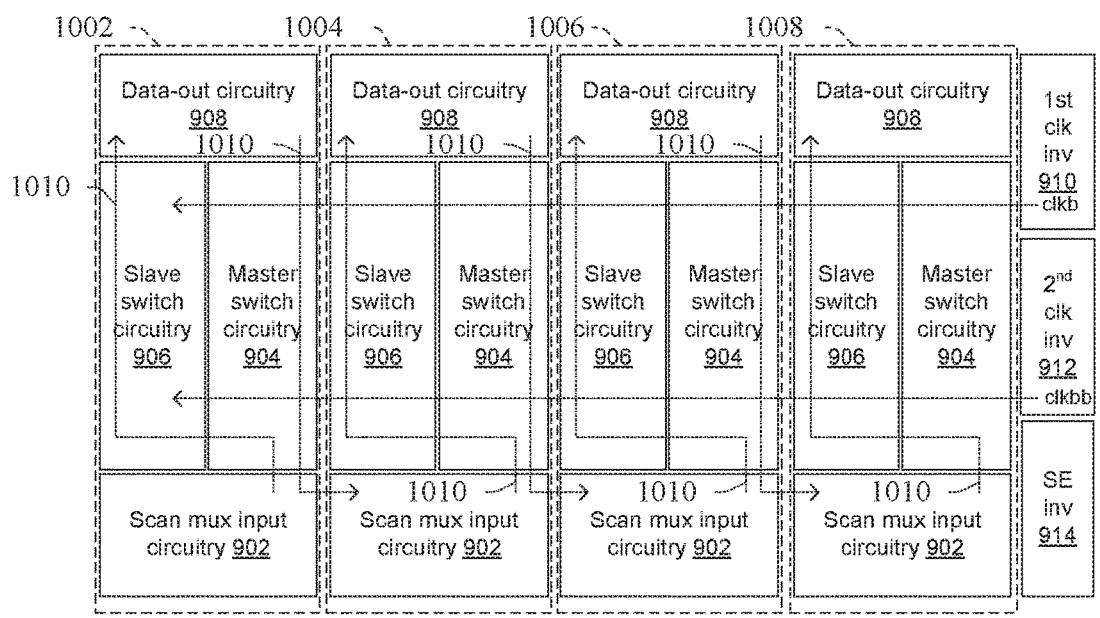
FIG. 10 illustrates a floor planning or layout view of a series of four scan flip-flops of FIG. 9 arranged according to some embodiments of the present disclosure.

FIG. 10 illustrates an example where four scan flip-flops, as laid out according to FIG. 9, are arranged in series with one another, so an output of one flip-flop is coupled to an input of the next flip-flop. Thus, FIG. 10 illustrates a first scan flip-flop 1002, second scan flip-flop 1004, third scan flip-flop 1006, and fourth scan flip-flop 1008, which are arranged in series with one another. The flip-flops are arranged to have edges that directly abut one another to provide a compact layout. The first and second clock inverter circuitry 910, 912, and scan enable inverter circuitry 914 are arranged along a peripheral edge of an outermost flip-flop 1008. The first and second clock inverter circuitry 910, 912, and scan enable inverter circuitry 914 could alternatively be arranged between neighboring flip-flops, analogous to as illustrated in FIG. 7. Data flow is illustrated generally by arrows 1010.

Figure 11:
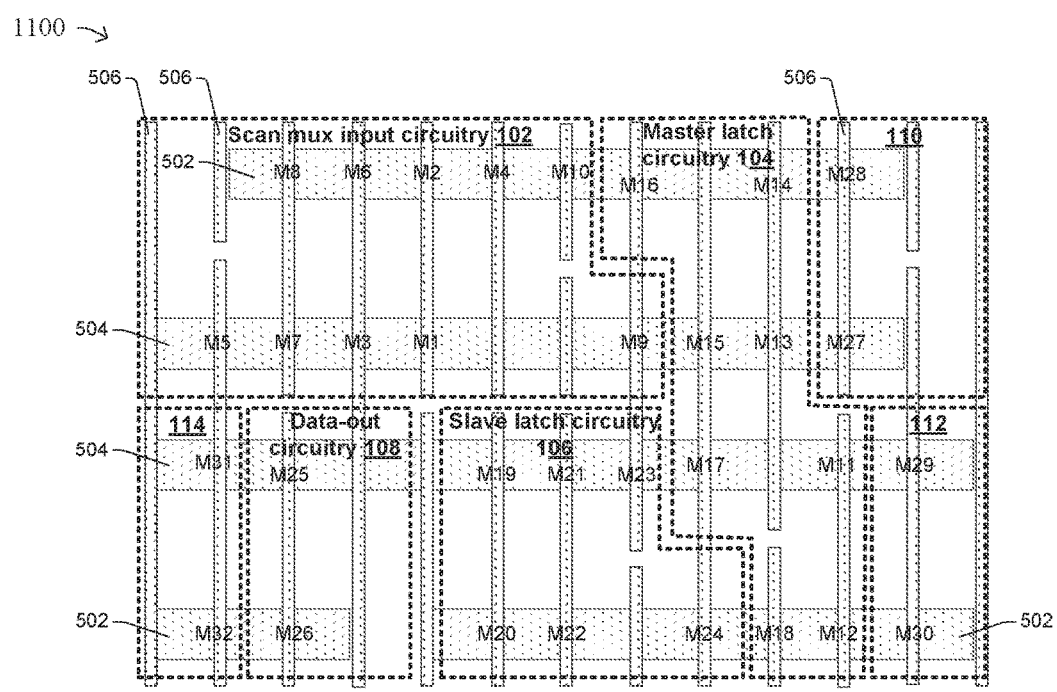
FIG. 11 illustrates a floor planning or layout view of a scan flip-flop according to some embodiments of the present disclosure.

FIG. 11 shows another layout view 1100, which is labeled to correspond to the functional blocks of FIG. 1C. It will be appreciated that in some embodiments, FIG. 11's layout is fully equivalent to the layout of FIG. 4-5A (just as FIG. 1C's schematic is fully equivalent to FIG. 2's schematic), except that the transistors M1-M32 have been abstracted to different functional blocks. Thus, for example, whereas FIG. 2's schematic includes master switch circuitry 204 (transistors M9, M10, M13-M16) and slave switch circuitry 206 (transistors M11, M12, M17, M18, M21-M24); FIG. 11's layout 1100 includes master latch circuitry (transistors M11-M18) and slave latch circuitry (M19-M24), again reflecting the different abstractions between FIG. 1C and FIG. 2. Thus, the present concept may be described in some embodiments with regards to master and slave switch circuitry (in which switches do not necessarily store a data state), while in other embodiments may be described with regards to master and slave latch circuitry (where latches have the capability to store data states).

Thus, the present disclosure relates to a flip-flop laid-out on a flip-flop region of a semiconductor substrate. The flip-flop includes master switch circuitry made of a first plurality of devices which are circumscribed by a master switch perimeter residing within the flip-flop region. Scan mux input circuitry is operably coupled to an input of the master switch circuitry. The scan mux input circuitry is made up of a second plurality of devices that are circumscribed by a scan mux perimeter which resides within the flip-flop region and which is non-overlapping with the master switch perimeter. Slave switch circuitry is operably coupled to an output of the master switch circuitry. The slave switch circuitry is made up of a third plurality of devices that are circumscribed by a slave switch perimeter which resides within the flip-flop region and which is non-overlapping with both the master switch perimeter and the scan mux perimeter.

In other embodiments, the present disclosure relates to an integrated circuit. The integrated circuit includes a plurality of flip-flops disposed on a semiconductor substrate. Respective flip-flops are disposed within respective flip-flop regions. A flip-flop includes master switch circuitry made up of a first plurality of devices which are circumscribed by a rectangular master switch perimeter that resides within the flip-flop region. Scan mux input circuitry is operably coupled to an input of the master switch circuitry. The scan mux input circuitry is made up of a second plurality of devices that are circumscribed by a rectangular scan mux perimeter which resides within the flip-flop region and which is non-overlapping with the master switch perimeter. Slave switch circuitry is operably coupled to an output of the master switch circuitry. The slave switch circuitry is made up of a third plurality of devices that are circumscribed by a rectangular slave switch perimeter. The slave switch perimeter resides within the flip-flop region and is non-overlapping with both the master switch perimeter and the scan mux perimeter.

In still other embodiments, the present disclosure relates to an integrated circuit. The integrated circuit includes master latch circuitry made up of a first plurality of transistors that are confined on a master latch region within a flip-flop region of a semiconductor substrate. Scan mux input circuitry is operably coupled to an input of the master latch circuitry and is made up of a second plurality of transistors that are confined on a scan mux region within the flip-flop region of the semiconductor substrate. The scan mux region is non-overlapping with the master latch region. Slave latch circuitry is coupled to an output of the master latch circuitry and is made up of a third plurality of transistors that are confined on a slave latch region within the flip-flop region of the semiconductor substrate. The slave latch region is non-overlapping with the master latch region and the scan mux region.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with a second figure (e.g., and may even correspond to a "second dielectric layer" in the second figure), and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flip-flop disposed as an integrated circuit layout on a flip-flop region of a semiconductor substrate, the flip-flop comprising:
    master switch circuitry made up of a first plurality of devices which are circumscribed by a master switch perimeter that resides within the flip-flop region;
    scan mux input circuitry operably coupled to an input of the master switch circuitry, the scan mux input circuitry being made up of a second plurality of devices that are circumscribed by a scan mux perimeter which resides within the flip-flop region and which is non-overlapping with the master switch perimeter; and
    slave switch circuitry operably coupled to an output of the master switch circuitry, the slave switch circuitry being made up of a third plurality of devices that are circumscribed by a slave switch perimeter; the slave switch perimeter residing within the flip-flop region and being non-overlapping with both the master switch perimeter and the scan mux perimeter.

2. The flip-flop of claim 1, wherein the scan mux perimeter has a first scan mux input edge that abuts a first master switch edge of the master switch perimeter, and wherein the slave switch circuitry has a first slave switch edge that abuts a second master switch edge of the master switch perimeter.

3. The flip-flop of claim 2, wherein the first master switch edge and the second master switch edge are perpendicular to one another.

4. The flip-flop of claim 3, further comprising:
data output circuitry made up of a fourth plurality of devices that are circumscribed by a data output perimeter within the flip-flop region of the semiconductor substrate, the data output perimeter being non-overlapping with the master switch perimeter, the scan mux perimeter, and the slave switch perimeter.

5. The flip-flop of claim 4, wherein the data output perimeter has a first data output edge abutting a second scan mux input edge of the scan mux perimeter, and wherein the data output perimeter has a second data output edge abutting a second slave switch edge of the slave switch perimeter.

6. The flip-flop of claim 2, wherein the first master switch edge and the second master switch edge are parallel to one another, such that the scan mux input circuitry and the slave switch circuitry are on opposite sides of the master switch perimeter.

7. The flip-flop of claim 1, further comprising:
data out circuitry coupled to an output of the slave switch circuitry and having an output terminal corresponding to an output of the flip-flop;
a first clock inverter configured to receive a clock signal and provide a clock bar signal based on the clock signal, wherein the clock bar signal is provided to the master switch circuitry and the slave switch circuitry;
a second clock inverter in series with the first clock inverter and configured to provide a clock-bar-bar signal based on the clock bar signal, wherein the clock-bar-bar signal is provided to the master switch circuitry and the slave switch circuitry.

8. The flip-flop of claim 7, further comprising:
a scan enable inverter configured to receive a scan enable signal and provide a scan-enable-bar signal based on the scan enable signal, wherein the scan-enable and scan-enable-bar signals are provided to the scan mux input circuitry.

9. The flip-flop of claim 1, wherein the master switch perimeter, the scan mux perimeter, and the slave switch perimeter are each rectangular in shape.

10. The flip-flop of claim 9, wherein the scan mux input circuitry and the master switch circuitry are arranged so their respective upper and lower edges are aligned, and wherein the slave switch circuitry is arranged so its upper edge abuts the lower edge of the master switch circuitry.

11. The flip-flop of claim 9, wherein the scan mux input circuitry, the master switch circuitry, and the slave switch circuitry are arranged so their respective outer edges are aligned, and wherein the master switch circuitry is arranged so its upper edge abuts a lower edge of the slave switch circuitry and its lower edge abuts an upper edge of the scan mux input circuitry.

12. The flip-flop of claim 7, wherein the scan mux input circuit has outer edges that are aligned with corresponding outer edges of the data out circuitry, and wherein the master switch circuitry and slave switch circuitry are each arranged to extend from an upper edge of the scan mux input circuitry to a lower edge of the data out circuitry, the slave switch circuitry and the master switch circuitry having neighboring side edges that abut one another.

13. An integrated circuit comprising:
a plurality of flip-flops disposed on a semiconductor substrate; wherein respective flip-flops are disposed within respective flip-flop regions, and wherein each flip-flop comprises:
master switch circuitry made up of a first plurality of devices which are circumscribed by a rectangular master switch perimeter that resides within the flip-flop region;
scan mux input circuitry operably coupled to an input of the master switch circuitry, the scan mux input circuitry being made up of a second plurality of devices that are circumscribed by a rectangular scan mux perimeter which resides within the flip-flop region and which is non-overlapping with the master switch perimeter; and
slave switch circuitry operably coupled to an output of the master switch circuitry, the slave switch circuitry being made up of a third plurality of devices that are circumscribed by a rectangular slave switch perimeter; the slave switch perimeter residing within the flip-flop region and being non-overlapping with both the master switch perimeter and the scan mux perimeter.

14. The integrated circuit of claim 13, wherein the scan mux input circuitry abuts a first side of the master switch circuitry, and the slave switch circuitry abuts a second side of the master switch circuitry, the second side being perpendicular to the first side.

15. The integrated circuit of claim 14, further comprising:
first and second clock inverter circuits which lie on a line extending in a first direction and which separate neighboring flip-flops of the plurality of flip-flops, wherein the first clock inverter circuit receives a clock signal and provides a clock-bar signal on a clock line to the flip-flops, wherein the clock line extends in a second direction, which is perpendicular to the first direction.

16. The integrated circuit of claim 13, wherein the scan mux input circuitry abuts a first side of the master switch circuitry, and the slave switch circuitry abuts a second side of the master switch circuitry, the second side being parallel to the first side.

17. The integrated circuit of claim 16, further comprising:
first and second clock inverter circuits which lie on a line extending in a first direction and which separate neighboring flip-flops of the plurality of flip-flops, wherein the first clock inverter circuit receives a clock signal and provides a clock-bar signal on a clock line to the flip-flops, wherein the clock line extends in a second direction, which is perpendicular to the first direction.

18. An integrated circuit comprising:
master latch circuitry made up of a first plurality of transistors that are confined on a master latch region within a flip-flop region of a semiconductor substrate;
scan mux input circuitry operably coupled to an input of the master latch circuitry and made up of a second plurality of transistors that are confined on a scan mux region within the flip-flop region of the semiconductor substrate, the scan mux region being non-overlapping with the master latch region; and
slave latch circuitry coupled to an output of the master latch circuitry and made up of a third plurality of transistors that are confined on a slave latch region within the flip-flop region of the semiconductor substrate, the slave latch region being non-overlapping with the master latch region and the scan mux region.

19. The integrated circuit of claim 18, wherein the master latch circuitry comprises a first set of cross-coupled inverters and the slave latch circuitry comprises a second set of cross-coupled inverters.

20. The integrated circuit of claim 19, wherein a transmission gate couples the first set of cross-coupled inverters to the second set of cross-coupled inverters.

* * * * *